United States Patent
Mosalikanti et al.

(10) Patent No.: US 8,248,124 B2
(45) Date of Patent: Aug. 21, 2012

(54) METHODS AND APPARATUSES FOR DELAY-LOCKED LOOPS AND PHASE-LOCKED LOOPS

(75) Inventors: Praveen Mosalikanti, Portland, OR (US); Nasser A. Kurd, Portland, OR (US); Christopher P. Mozak, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 161 days.

(21) Appl. No.: 12/793,533

(22) Filed: Jun. 3, 2010

(65) Prior Publication Data

US 2011/0298501 A1 Dec. 8, 2011

(51) Int. Cl.
*H03L 7/06* (2006.01)
(52) U.S. Cl. ........................ 327/158; 327/149
(58) Field of Classification Search ................ 327/148, 327/157
See application file for complete search history.

(56) References Cited

U.S. PATENT DOCUMENTS

| | | | |
|---|---|---|---|
| 2002/0175771 A1* | 11/2002 | Cyrusian | 331/25 |
| 2005/0189972 A1 | 9/2005 | Foo et al. | |
| 2006/0164139 A1* | 7/2006 | Chong et al. | 327/158 |
| 2007/0164797 A1* | 7/2007 | Law et al. | 327/149 |
| 2007/0194818 A1 | 8/2007 | Kim et al. | |
| 2007/0195637 A1* | 8/2007 | Lin | 365/233 |
| 2008/0191762 A1* | 8/2008 | Seethamraju et al. | 327/158 |
| 2009/0085618 A1 | 4/2009 | Schneider et al. | |
| 2010/0123497 A1 | 5/2010 | Zhang et al. | |
| 2011/0050998 A1* | 3/2011 | Gao et al. | 348/536 |
| 2011/0095794 A1* | 4/2011 | Dubost et al. | 327/158 |
| 2011/0298501 A1* | 12/2011 | Mosalikanti et al. | 327/143 |

OTHER PUBLICATIONS

International Search Report and Written Opinion of the International Searching Authority for International Application No. PCT/US2011/038361, mailed Dec. 28, 2011, 8 pages.

* cited by examiner

*Primary Examiner* — Lincoln Donovan
*Assistant Examiner* — Adam Houston
(74) *Attorney, Agent, or Firm* — Schwabe, Williamson & Wyatt, P.C.

(57) ABSTRACT

A low power delay-locked loop (DLL) is presented. In one embodiment, the DLL includes a phase detector which includes a reference input and a feedback input to determine a phase difference. The DLL also includes a controller to determine whether to provide a signal to both the reference input and the feedback input such that the reference input and the feedback input receive an identical input, for example, during low power operation.

23 Claims, 5 Drawing Sheets

METHODS AND APPARATUSES FOR DELAY-LOCKED LOOPS AND PHASE-LOCKED LOOPS

FIELD OF THE INVENTION

Embodiments of the invention relate to a delay-locked loop or a phase-locked loop; more particularly, a low power delay-locked loop or a low power phase-locked loop.

BACKGROUND OF THE INVENTION

DDR interfaces typically use several DLLs (DLLs) where each DLL drives several phase interpolators (PIs). Each PI is used to provide adjustable delay on a pin or a set of pins to help meet timing constraints.

During a period of inactivity, the DLLs are not shut down because of the long relock time involved (typically on the order of 100-200 ns). Some circuitry only powers down the DLL if the circuitry is shut down for long enough to allow the DLL to relock after being powered up.

In power down modes (e.g., DDR CKE power down), the exit latency frequently cannot be more than 10-20 ns. DLLs are not likely to be powered down if such a requirement exists. The total current consumed by the all the DLLs in a DDR port may be about 100 mA. This leads to a waste of power usage when the circuitry is inactive.

Often, DLLs can be reused in more than one application but with different bandwidth requirements. A DLL with a programmable bandwidth is suitable for design reuse which would greatly save time and cost of development.

BRIEF DESCRIPTION OF THE DRAWINGS

Embodiments of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE INVENTION

Methods and apparatuses for delay-locked loops (DLLs) and phase-locked loops (PLLs) are presented with the reference to a delay-locked loop (DLL). In one embodiment, the DLL includes a phase detector which includes a reference input and a feedback input to determine a phase difference. The DLL also includes a controller to determine whether to provide a signal to both the reference input and the feedback input such that the reference input and the feedback input receive an identical input, for example, during low power operation.

In the following description, numerous details are set forth to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of present invention also relate to apparatuses for performing the operations herein. Some apparatuses may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, DVD-ROMs, and magnetic-optical disks, read-only memories (ROMs), random access memories (RAMs), EPROMs, EEPROMs, NVRAMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, embodiments of the present invention are not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

The method and the apparatus described herein are primary discussed in reference to low power DLLs. However, the method and the apparatus are not limited to low power DLLs, they may be implemented in conjunction with low power PLLs. In addition, lower power DLLs are primarily discussed in reference to a processor computer system. They may be implemented on or in association with any integrated circuit device or system, such as cell phones, personal digital assistants, embedded controllers, mobile platforms, desktop platforms, and server platforms.

Overview

Methods and apparatuses for DLLs and PLLs are presented with the reference to a low power delay-locked loop (DLL). In one embodiment, the DLL includes a phase detector which includes a reference input and a feedback input to determine a phase difference. The DLL also includes a controller to determine whether to provide a signal to both the reference input and the feedback input such that the reference input and the feedback input receive an identical input, for example, during low power operation.

Figure 1:
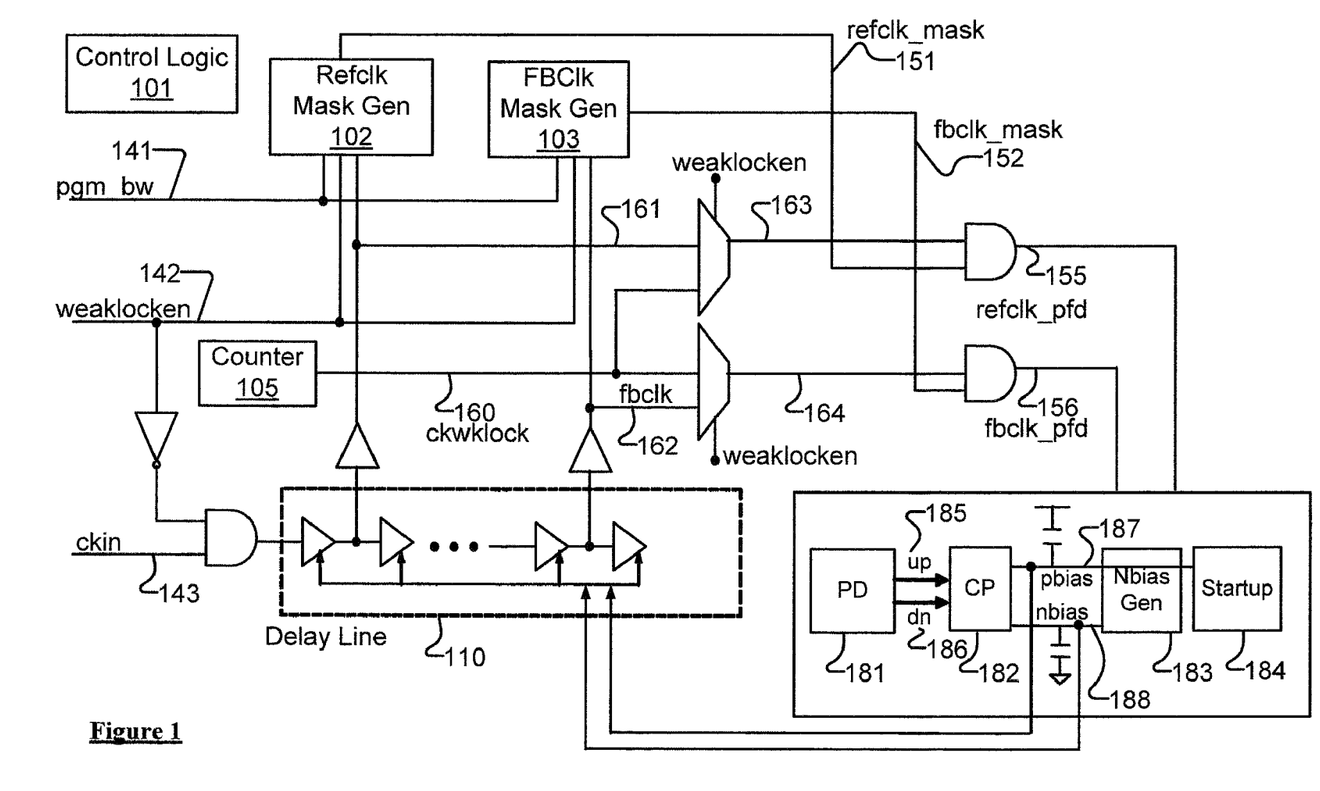
FIG. 1 is a block diagram of a low power delay-locked loop in accordance with one embodiment of the invention.

FIG. 1 is a block diagram of a low power delay-locked loop (DLL) in accordance with one embodiment of the invention. Many related components such as buses and peripherals have not been shown to avoid obscuring the invention. Referring to FIG. 1, the DLL includes control logic 101, refclk mask generator 102, fbclk mask generator 103, counter 105, delay line 110, and a cell which includes phase detector 181, charge pump 182, Nbias generator 183, and startup circuitry 184. In one embodiment, the DLL receives inputs, such as, for example, ckin 143, weaklocken 142, and programmable_bw 141. Output of the DLL (not shown) includes outputs from delay line 110 including fbclk 162.

In one embodiment, the aforementioned units are shown as discrete devices. Other embodiments are possible where some or all of these units are integrated within a device or within other devices. In other embodiments, the aforementioned units are distributed throughout a system in hardware, software, or some combination thereof.

In one embodiment, phase detector 181, charge pump 182, Nbias generator 183, startup circuitry 184, and delay line 110 are components of a conventional DLL. A DLL may also include loop filters.

In one embodiment, delay line 110 receives an incoming clock (i.e., ckin 143) and delays the signal using cascaded delay stages to generate a set of equally spaced taps. The delay through the individual delay elements is controlled using bias voltages (pbias 187 and nbias 188). In one embodiment, the equal phase distance is possible by controlling each delay stage in delay line 110 using a same control tap. In one embodiment, delay line 110 generates multiphase signals based on an input given (for example, if the clock cycle is 400 ps, delay line 110 generates 8 signals with phases equally spaced about 50 ps per phase).

In one embodiment, two nominally identical taps (taps delayed by a full reference clock cycle, e.g., refclk 161 and fbclk 162) are fed into phase detector 181 (as refclk_pfd 155 and fbclk_pfd 156). Phase error between the nominally identical taps is integrated by charge-pump 182 and a loop filter capacitor to generate bias voltages. A negative feedback loop adjusts the control voltages (and hence the delay of the individual buffers of delay line 110) in a direction that reduces phase error.

In one embodiment, phase detector 180 (or phase and frequency detector) generates Up 185 and Down 186 signals in response to the phase comparison between the reference clock (refclk 161) and feedback clock (fbclk 162). Up 185 and Down 186 drive charge pump 182 which generates a voltage.

In one embodiment, Nbias generator 183 generates nbias voltages based on pbias voltages from charge pump 182. During an initial setup, startup circuitry 184 pulls pbias 187 down to zero. This causes nbias 188 to increase to the highest value. Delay line 110 is set at the fastest setting if the nbias 188 is at its highest value. After a certain length of time, phase detector 181 is enabled and bias voltages are released. The feedback loop tries to lock to the reference frequency.

In one embodiment, a DLL includes at least two bias voltage cells. The values of pbias 187 is in the range of −0.25 to 0.65 V. The value of nbias 188 is in the range of 0.35-0.65 V. In one embodiment, when the circuit is off, pbias 187 is pulled up to VDD and nbias 188 is pulled down to VSS (0). In one embodiment, a higher value of pbias 187 slows down delay line 110, whereas a higher value of nbias 188 speeds up delay line 110.

In one embodiment, a DLL includes control logic 101 to enter and to exit a weak locked state (one of the low power modes). Control logic 101 generates programmable_bw 141 and weaklocken 142. Control logic 101 puts the feedback loop in a weakly locked state (referred herein as a weaklock mode).

Low Power Operation

In one embodiment, control logic 101 lowers the power consumed during periods of inactivity by shutting down delay line 110 while maintaining the bias voltages close enough to the locked values to enable a fast wakeup and relock. During the weaklock mode, delay line 110 is shut down (completely) while identical signals (a clock signal) at a lower clock rate are sent to phase detector 181 to emulate the reference clock input (refclk) and feedback clock input (fbclk) of the DLL under locked conditions. In one embodiment, both the reference clock input (refclk) and the feedback clock input (fbclk) are disabled during weaklock mode. In one embodiment, depending on circuit architecture, charge pump 182 and phase detector 181 are powered down.

In one embodiment, when the clock to delay line 110 is shut down and the feedback loop is disabled, the bias voltage leaks towards one of the voltage supplies because it is no longer actively driven. In order to support a fast relock, both pbias 187 and nbias 188 are maintained very close to the ideal closed-loop value even when the DLL is partially or fully shutdown. In one embodiment, the bias voltages are periodically refreshed.

In one embodiment, control logic 101 determines whether to provide a clock signal to both the reference input and the feedback input (refclk_pfd 155 and fbclk_pfd 156) of phase detector 181, so that both inputs receive an identical source of input. Control logic 101 shuts down delay line 110 and other unnecessary circuits while leaving the biases on. Control logic 110 feeds an alternate clock to emulate a locked system and the alternate clock is of a lower frequency than ckin 143. In one embodiment, control logic 101 controls the source of refclk_pfd 155 and fbclk_pfd 156 by controlling programmable_bw 141 and weaklocken 142.

In one embodiment, counter 105 generates a clock signal (e.g., ckwklock 160). Control logic 101 sets refclk_pfd 155 and fbclk_pfd 156 (by using programmable_bw 141 and weaklocken 142) to receive the clock signal to emulate a lock condition. For example, if weaklocken 142 is asserted, ckwklock 160 becomes the source to phase detector 181. Phase detector 181 receives identical signals from refclk_pfd 155 and fbclk_pfd 156 with no phase error (emulating a locked condition). Phase detector 180 generates identical Up 185 and Down 186. Charge pump 182 turns on an equal amount of currents on the bias voltages, thus holding the bias voltages steady.

In one embodiment, counter 105 generates ckwklock 160 which is of a lower frequency compared to the clock used during normal operation. In one embodiment, other approaches would be used to disable phase detector 181, charge pump 182, or both.

Refclk mask generator 102 and fbclk mask generator 103 will be described in further detail below with additional references to the remaining figures.

Bias Voltage

In one embodiment, when the DLL are shut down for extended periods of time, there could be a drift in the bias voltage (and an associated phase error between refclk 161/fbclk 162). In one embodiment, a drift in the bias voltages are corrected (or reduced) by periodically locking the DLL using the original refclk 161 and fbclk 162 from delay line 110. In one embodiment, control logic 101 periodically turns on the DLL to maintain bias voltages (e.g., relock every 500 ns). The operation is also referred to herein as a fast wakeup or a relock. In one embodiment, the DLL performs a fast wakeup for a few clock cycles before going back into the weaklock mode. For example, control logic 101 turns on the DLL (including phase detector 181 and charge pump 182) at a programmable interval and provides refclk 161 and fbclk 162 for one or more clock cycles to prevent a significant drift or to maintain voltage levels held by the two bias voltage cells. In one embodiment, depending on circuit architecture, charge pump 182 and phase detector 181 are powered down.

In one embodiment, control logic 101 provides a clock to delay line 110 and then, in a subsequent clock cycle, disables delay line 110 but enables the inputs to phase detector 181. As such, the relock process is performed for one clock cycle.

In one embodiment, the bias voltage is close to the correct value and therefore the number of clock cycles required to refine the bias voltage is small. In one embodiment, the exit time from the weakly locked state is about 10 clock cycles.

For example, the DLL is locked when pbias 187 is at 0.5 V. In one embodiment, if the total leakage towards Vcc is higher than the total leakage towards Vss, the value of pbias 187 begins to drift upwards. After about a period of time (e.g., 200 ns), depending on the amount of leakage, pbias 187 may be at 0.51 V. Control logic 101 de-asserts weaklocken 142 so that the DLL attempts to relock. In a few clock cycles, the DLL is able to relock and the value of pbias 187 is brought back to 0.5 V.

In one embodiment, the DLL is able to relock (fast recovery) within 1 ns. The power saving is about 60-70% in some embodiments. This enables the DLL to be powered down even though other circuitry is powered down for only a short period, for example, less than 25 ns. Without the weaklock mode, a DLL, in order to relock, needs to charge up the control voltage and to use a comparator to stop the chargeup process.

Figure 2:
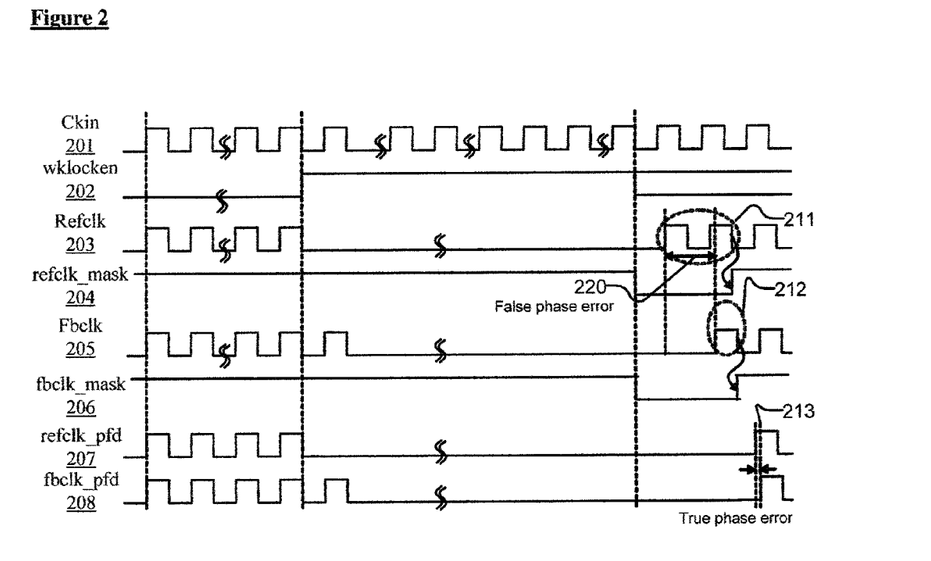
FIG. 2 is a waveform diagram for a weaklock operation in accordance with one embodiment of the invention.

FIG. 2 is a waveform diagram for a weaklock operation in accordance with one embodiment of the invention. Referring to FIG. 2, the signals include ckin 201, wklocken 202, refclk 203, refclk_mask 204, fbclk 205, fbclk_mask 206, refclk_pfd 207, and fbclk_pfd 208. In one embodiment, the signals correspond to ckin 143, wklocken 142, refclk 161, refclk_mask 151, fbclk 162, fbclk_mask 152, refclk_pfd 155, and fbclk_pfd 156, respectively (with respect to FIG. 1).

In one embodiment, for example, when exiting the weaklock mode, delay line 110 is enabled. Note that refclk 161 is one cycle ahead of fbclk 162. If the inputs to phase detector 181 are switched from ckwklock 160 to refclk 161 and fbclk 162 immediately upon exit from the weaklock state, phase detector 180 may detect a phase error (e.g., false phase error 220) of almost a clock cycle from the first refclk 203 edge to the corresponding edge of fbclk 205. Phase detector 181 may mistakenly attempt to reduce the delay because of the false phase error 220.

In one embodiment, refclk mask generator 102 generates a signal (e.g., refclk_mask 151) to inhibit (mask) refclk pulses (e.g., 211) when the DLL exits from a weaklock mode. In one embodiment, refclk_mask 204 and fbclk_mask 206 ensure that phase error information is retained during the wakeup to support fast relock.

In one embodiment, refclk_mask generator 102 generates a mask signal to inhibit signal 163 for at least one clock cycle. Signal 163 (with respect to FIG. 1) is the source of refclk 161 if weakloaden 142 is not asserted. In one embodiment, refclk_mask 204 at least masks the first clock cycle of the refclk 203 after exiting from the weaklock mode. In other embodiment, two or more clock cycle of refclk 203 are inhibited.

In one embodiment, depending on the amount of drift in the bias voltages, there exists a risk of potential glitches when switching to different clock signals. This risk of glitches is avoided by generating refclk_mask 204 and fbclk_mask 206 based on the negative edges of refclk 203 and fbclk 205 respectively (rather than based on ckin 201).

Figure 3:
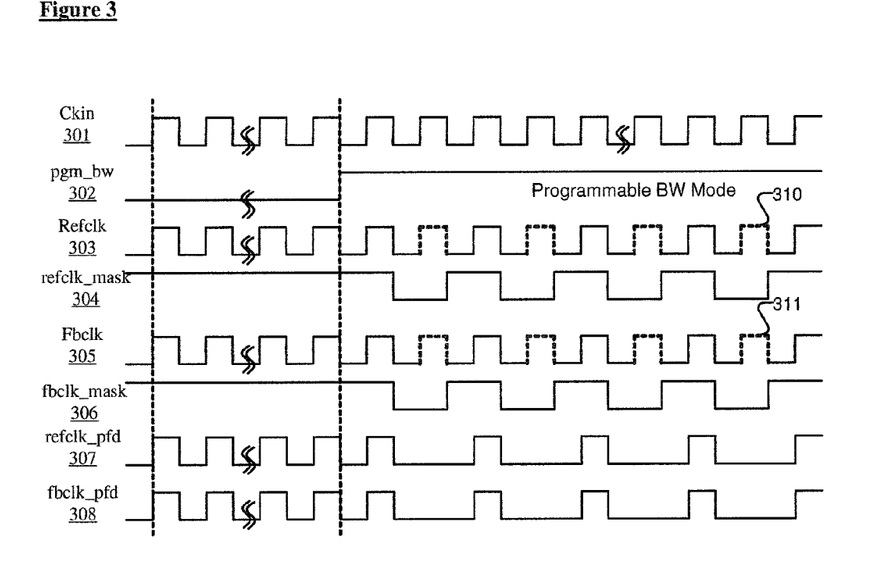
FIG. 3 is a waveform diagram for a programmable frequency operation in accordance with one embodiment of the invention.

FIG. 3 is a waveform diagram for a programmable frequency operation in accordance with one embodiment of the invention. Referring to FIG. 3, the signals include ckin 301, programmable_bw 302, refclk 303, refclk_mask 304, fbclk 305, fbclk_mask 306, refclk_pfd 307, and fbclk_pfd 308. In one embodiment, the signals correspond to ckin 143, programmable_bw 141, refclk 161, refclk_mask 151, fbclk 162, fbclk_mask 152, refclk_pfd 155, and fbclk_pfd 156 respectively (with respect to FIG. 1).

In one embodiment, the DLL provides programmability over loop bandwidth by using digital control of the update rate of phase detector 181 during normal operation. A same charge pump similar to charge pump 182 is used (no new design is required) by using the programmable bandwidth mechanism.

For example, to reduce the frequency into half, refclk_mask 304 and fbclk_mask 306 are generated such that every alternate refclk 303 and fbclk 305 are inhibited (e.g., pulse 310 and pulse 311). The result is shown as refclk_pfd 307 and fbclk_pfd 308 in FIG. 4. In one embodiment, the DLL is reusable for generating different bandwidths as required.

In one embodiment, refclk_mask generator 102 and fbclk_mask generator 103 generate mask signals to inhibit refclk 303 and fbclk 305 (respectively) for a plurality of clock cycles in order to control the frequencies of the signals.

Figure 4:
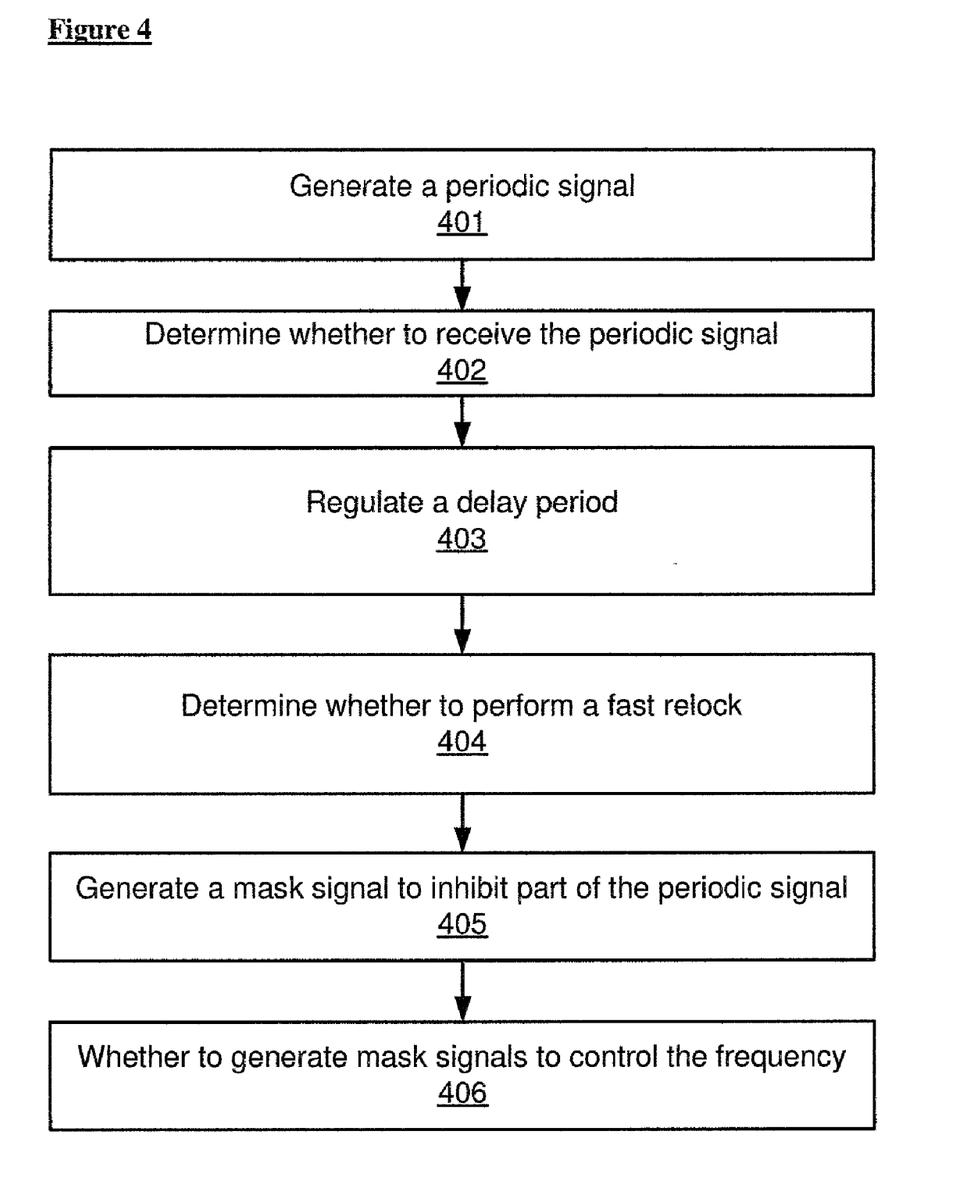
FIG. 4 is a flow diagram of one embodiment of a process for a low power delay-locked loop.

FIG. 4 is a flow diagram of one embodiment of a process for a low power delay-locked loop. The process is performed by processing logic that may comprise hardware (circuitry, dedicated logic, etc.), software (such as one that is run on a general purpose computer system or a dedicated machine), or a combination of both. In one embodiment, the process is performed in conjunction with a DLL with respect to FIG. 1. In one embodiment, the process is performed in conjunction with a computer system with respect to FIG. 5. In one embodiment, the process is performed in conjunction with a low power PLL.

Referring to FIG. 4, in one embodiment, processing logic begin by generating a periodical signal (process block 401). Processing logic determines whether to set both a reference input and a feedback input of a phase detector to receive the same periodic signal (process block 402). In one embodiment, in response to a power-saving mode, processing logic determines whether to use the periodic signal as inputs to a phase detector when delay cells are powered down to save power.

In one embodiment, processing logic regulates the delay period of multiple delay stages in a delay line (process block 403). In one embodiment, the delay period is based at least on a phase difference generated by the phase detector.

In one embodiment, processing logic determines whether to perform a fast relock periodically (process block 404). For example, the fast relock is performed for two or more clock cycles to maintain voltage levels held by bias voltage cells. Processing logic sets the reference input and the feedback input to receive a signal from the first delay cell and a signal from a nominal delay cell respectively during the fast relock.

In one embodiment, processing logic generates a mask signal to inhibit a periodic signal received at the reference input for at least one clock cycle (process block 405). In one embodiment, the periodic signal received at the reference input is approximately one clock cycle ahead of the periodic signal received at the feedback input.

In one embodiment, processing logic determines whether to generate mask signals to inhibit periodic clock signals for a plurality of clock cycles, to control the frequencies of output signals (process block 406).

Figure 5:
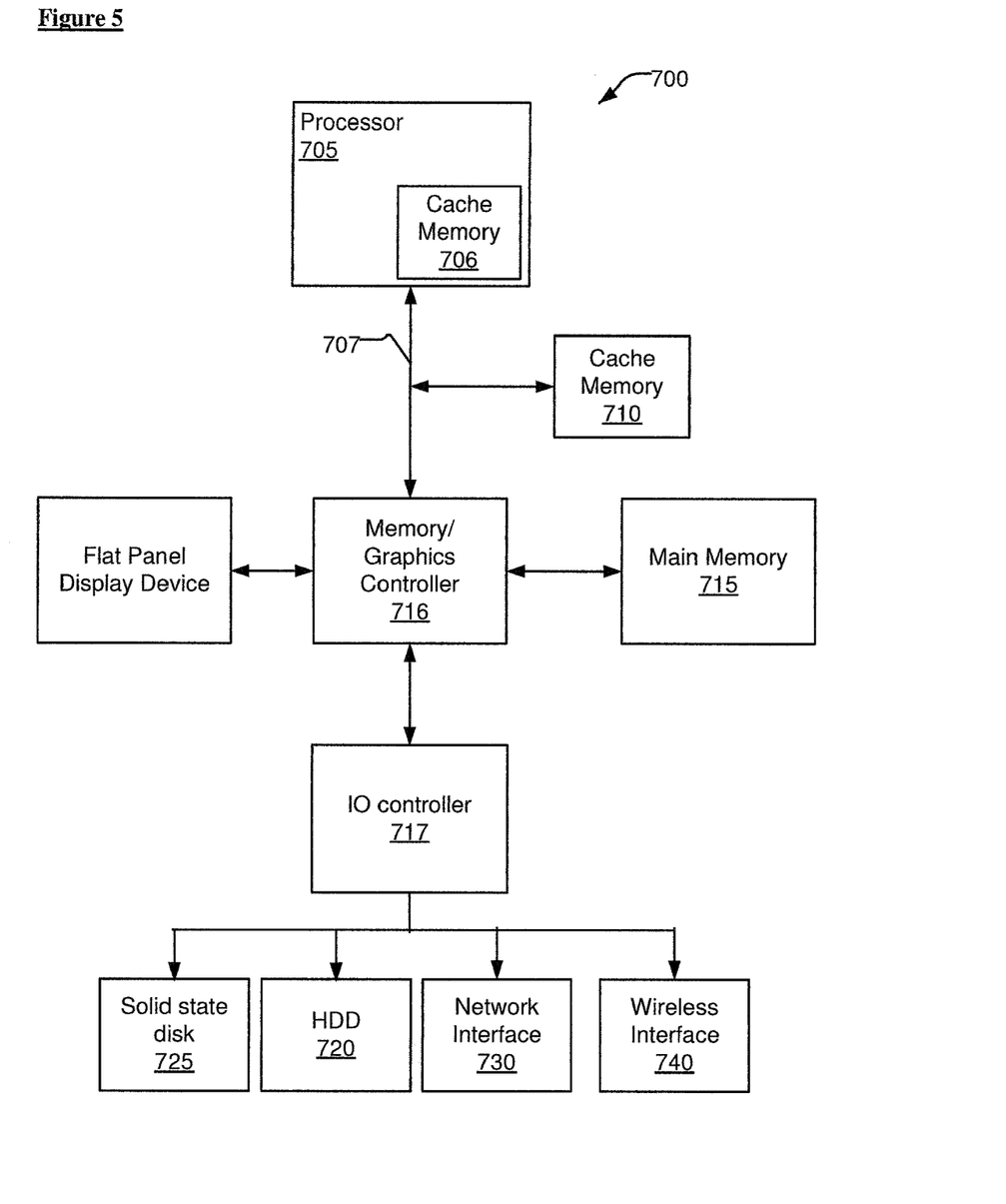
FIG. 5 illustrates a computer system for use with one embodiment of the present invention.

FIG. 5 illustrates an example of a computer system in conjunction with one embodiment of the invention. Processor 705 accesses data from level 1 (L1) cache memory 706, level 2 (L2) cache memory 710, and main memory 715. In one embodiment, cache memory 710 is a shared cache for more than one processor core.

In one embodiment, memory/graphic controller 716, IO controller 717, or combinations thereof is integrated in processor 705. In one embodiment, parts of memory/graphic controller 716, parts of IO controller 717, or combinations thereof is integrated in processor 705.

Processor 705 may have any number of processing cores. Other embodiments of the invention, however, may be implemented within other devices within the system or distributed throughout the system in hardware, software, or some combination thereof.

Main memory 715 may be implemented in various memory sources, such as dynamic random-access memory (DRAM), hard disk drive (HDD) 720, solid state disk 725 based on NVRAM technology, or a memory source located remotely from the computer system via network interface 730 or via wireless interface 740 containing various storage devices and technologies. The cache memory may be located either within the processor or in close proximity to the processor, such as on the processor's local bus 707. Furthermore, the cache memory may contain relatively fast memory cells, such as a six-transistor (6T) cell, or other memory cell of approximately equal or faster access speed.

Other embodiments of the invention, however, may exist in other circuits, logic units, or devices within the system of FIG. 5. Furthermore, in other embodiments of the invention may be distributed throughout several circuits, logic units, or devices illustrated in FIG. 5.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chipset components, programmable logic arrays (PLA), memory chips, network chips, or the like. Moreover, it should be appreciated that exemplary sizes/models/values/ranges may have been given, although embodiments of the present invention are not limited to the same. As manufacturing techniques (e.g., photolithography) mature over time, it is expected that devices of smaller size could be manufactured.

Whereas many alterations and modifications of the embodiment of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

What is claimed is:

1. An apparatus comprising:
a phase detector comprising a reference input and a feedback input to determine a phase difference;
a controller coupled to the phase detector to selectively enable the phase detector to determine the phase difference, the controller to determine whether to perform a relock for a duration of one or more clock cycles to maintain voltage levels held by one or more bias voltage cells; and
a charge pump coupled to receive a drive signal from the phase detector, the charge pump to control a delay period associated with a plurality of delay cells, based on the phase difference from the phase detector and in response to the drive signal.

2. The apparatus of claim 1, further comprising a counter to generate a first signal, wherein the controller is operable to set both the reference input and the feedback input to receive the first signal to maintain the phase difference.

3. The apparatus of claim 1, wherein the plurality of delay cells includes a first delay cell and a second delay cell, wherein the controller is operable to cause the reference input and the feedback input to receive an input of the first delay cell and an output of the second delay cell respectively.

4. The apparatus of claim 1, wherein the controller determines to perform the relock in response to a power saving mode during which the plurality of delay cells are powered down.

5. The apparatus of claim 1, wherein the controller is operable to determine whether or not to power down the phase detector, the charge pump, or both.

6. The apparatus of claim 1, wherein the controller is operable to cause to perform, periodically, the relock for the duration of one or more clock cycles.

7. The apparatus of claim 1, wherein the controller is operable to generate a first mask signal to inhibit, for at least one clock cycle, a first periodic signal received at the reference input if the first periodic signal is approximately one clock cycle ahead of a second periodic signal received at the feedback input.

8. The apparatus of claim 1, wherein the controller is operable to generate a first mask signal and a second mask signal, for a plurality of clock cycles, to control the frequencies of signals which the reference input and the feedback input receive.

9. The apparatus of claim 2, wherein a frequency of the first signal is lower than an operating frequency of a clock signal which the reference clock input receives under a normal power mode.

10. A method comprising:
- determining, in response to a power-saving mode, whether to perform a relock for a duration of one or more clock cycles to maintain voltage levels held by one or more bias voltage cells; and
- setting a reference input and a feedback input of a phase detector to receive a first periodic signal from a first delay cell and a second periodic signal from a second delay cell respectively, wherein the first and the second delay cells are a part of a plurality of delay cells.

11. The method of claim 10, further comprising determining whether to provide a first signal to both the reference input and the feedback input in response to the power saving mode during which a plurality of delay cells are powered down.

12. The method of claim 10, further comprising controlling a delay period associated with the plurality of delay cells based at least on a phase difference generated by the phase detector.

13. The method of claim 10, further comprising determining whether to perform, periodically, the relock for the duration of one or more clock cycles.

14. The method of claim 10, further comprising generating a first mask signal to inhibit, for at least one clock cycle, a first periodic signal received at the reference input if the first periodic signal is approximately one clock cycle ahead of a second periodic signal received at the feedback input.

15. The method of claim 10, further comprising generating a first mask signal and a second mask signal, for a plurality of clock cycles, to control frequencies of signals which the reference input and the feedback input receive.

16. A system comprising:
- a processor; and
- a memory interface coupled to the processor and comprising a delay-locked loop, the delay-locked loop comprising:
  - a phase detector comprising a reference input and a feedback input to determine a phase difference based on the two inputs;
  - a controller coupled to the phase detector to selectively enable the phase detector to determine the phase difference, the controller to determine whether to perform a relock for a duration of one or more clock cycles to maintain voltage levels held by one or more bias voltage cells; and
  - a charge pump coupled to receive a drive signal from the phase detector, the charge pump coupled to control a delay period associated with a plurality of delay cells, based on the phase difference from the phase detector.

17. The system of claim 16, further comprising a counter to generate a first signal, wherein the controller is operable to set the reference input and the feedback input to receive an identical signal, which is the first signal, in response to a power-saving mode.

18. The system of claim 16, wherein the controller is operable to periodically perform the relock for the duration of one or more clock cycles.

19. The system of claim 16, wherein the controller is operable to generate a first mask signal to inhibit, for at least one clock cycle, a first periodic signal received at the reference input if the first periodic signal is approximately one clock cycle ahead of a second periodic signal received at the feedback input.

20. The system of claim 16, wherein the controller is operable to generate a first mask signal and a second mask signal, for a plurality of clock cycles, to control the frequencies of signals which the reference input and the feedback input receive.

21. An apparatus comprising:
- a phase detector comprising a reference input and a feedback input to determine a phase difference;
- a controller coupled to the phase detector to selectively enable the phase detector to determine the phase difference, the controller to determine whether to perform a relock for a duration of one or more clock cycles to maintain voltage levels held by one or more bias voltage cells; and
- a counter to generate a first signal, wherein the controller is operable to set both the reference input and the feedback input to receive the first signal to maintain the phase difference.

22. An apparatus comprising:
- a phase detector comprising a reference input and a feedback input to determine a phase difference;
- a controller coupled to the phase detector to selectively enable the phase detector to determine the phase difference, the controller to determine whether to perform a relock for a duration of one or more clock cycles to maintain voltage levels held by one or more bias voltage cells; and
- a plurality of delay cells, wherein the controller determines to perform the relock in response to a power saving mode during which the plurality of delay cells are powered down.

23. An apparatus comprising:
- a phase detector comprising a reference input and a feedback input to determine a phase difference; and
- a controller coupled to the phase detector to selectively enable the phase detector to determine the phase difference, the controller to determine whether to perform a relock for a duration of one or more clock cycles to maintain voltage levels held by one or more bias voltage cells, wherein the controller is operable to generate a first mask signal and a second mask signal, for a plurality of clock cycles, to control the frequencies of signals which the reference input and the feedback input receive.

* * * * *